United States Patent [19]
Ohno

[11] Patent Number: 5,668,044
[45] Date of Patent: Sep. 16, 1997

[54] METHOD OF FORMING ELEMENT ISOLATING REGION IN A SEMICONDUCTOR DEVICE

[75] Inventor: Yoshikazu Ohno, Hyogo, Japan

[73] Assignee: Mitsubishi Denki Kabushiki Kaisha, Tokyo, Japan

[21] Appl. No.: 653,982

[22] Filed: May 28, 1996

Related U.S. Application Data

[63] Continuation of Ser. No. 457,006, Jun. 1, 1995, abandoned.

[30] Foreign Application Priority Data

Dec. 28, 1994 [JP] Japan ................... 6-326970

[51] Int. Cl.$^6$ ........................... H01L 21/76
[52] U.S. Cl. ................. 438/433; 148/DIG. 50
[58] Field of Search ............. 437/67, 26, 25; 148/DIG. 50

[56] References Cited

U.S. PATENT DOCUMENTS

| | | | |
|---|---|---|---|
| 4,523,369 | 6/1985 | Nagakubo | 437/67 |
| 4,692,992 | 9/1987 | Hsu | 437/67 |
| 5,118,636 | 6/1992 | Hosaka | 437/67 |

OTHER PUBLICATIONS

Wolf; "Silicon Processing For the VLSI Era" vol. 1: Process Technology; Lattice Press, 1986, pp. 407–409.
"A Highly Manufacturable Trench Isolation Process For Deep Submicron Drams", Pierre Fazan et al., IEDM 1993, pp. 57–60.

*Primary Examiner*—Trung Dang
*Attorney, Agent, or Firm*—Lowe, Price, LeBlanc & Becker

[57] ABSTRACT

An insulating film is formed on a main surface of a semiconductor substrate. A resist layer is formed on the entire surface of insulating film. An opening is formed in resist layer. By using resist layer as a mask, insulating film is etched, an opening is formed, and then resist is removed. By using insulating film as a mask, an impurity is introduced by ion implantation, and thus an ion-implanted impurity layer is formed. Heat treatment is performed so that ions included in ion-implanted impurity layer are diffused, forming an impurity layer. Etching is performed using insulating film as a mask, and trench is formed with an impurity layer left on the side and bottom surfaces of the trench, which impurity layer serves as a channel stopper. Then, a buried insulating layer is formed in the trench. Consequently, a method of forming an element isolating region is provided by which an impurity layer constituting the element isolating region can be formed minutely with easier control.

5 Claims, 13 Drawing Sheets

METHOD OF FORMING ELEMENT ISOLATING REGION IN A SEMICONDUCTOR DEVICE

This application is a continuation of application Ser. No. 08/457,006 filed Jun. 1, 1995 now abandoned.

BACKGROUND OF THE INVENTION

1. Field of the Invention

The present invention relates to a method of forming element isolating region in a semiconductor device.

2. Description of the Background Art

Recently, as the degree of integration of semiconductor devices such as a dynamic random access memory (DRAM) has been increased, an application of a trench isolation method which allows element isolation in smaller region as compared with the conventional LOCOS has been proposed as a method of forming element isolation.

An example in which trench isolation method is employed for isolating elements at a memory cell portion of a dynamic random access memory will be described with reference to FIGS. 19 to 24.

First, referring to FIG. 19, a resist layer 2 is formed on a main surface of a semiconductor substrate 1 of a silicon substrate having a first conductivity type (for example, P type). An opening a is formed in resist layer 2. The opening 2a of resist layer 2 is formed at a position on which an element isolating region is formed on the semiconductor substrate 1 surrounding the element forming region of semiconductor substrate 1.

Using resist layer 2 having the opening 2a as a mask, the main surface of semiconductor substrate 1 exposed through opening 2a is etched by conventional etching technique, and a trench 3 is formed at the element isolation forming region of semiconductor substrate 1.

Then, referring to FIG. 20, using resist 2 having opening 2a formed as a mask, an impurity of a first conductivity type is introduced by ion implantation and Oblique ion implantation, thus an impurity layer 4 (serving as a channel stopper) for isolating elements is formed on the bottom surface and side surfaces of trench 3 formed in semiconductor substrate 1.

Then, referring to FIG. 21, resist layer 2 is removed, an insulating layer is formed by the CVD method on the main surface and in the trench 3 of semiconductor substrate 1, and thereafter the insulating layer is etched back so as to remove the insulating layer on the main surface of semiconductor substrate 1 entirely, whereby a buried insulating layer 5 is formed only in trench 3.

By the trench 3, impurity layer 4 and buried insulating layer 5 formed in this manner, an element isolation region surrounding the element forming region of semiconductor substrate 1 is provided.

Referring to FIG. 22, on the main surface of semiconductor substrate 1 and on the buried insulating layer 5, a gate insulating film 6 of silicon oxide (SiO$_2$) is formed, a polycrystalline silicon layer is formed on gate insulating film 6, the polycrystalline silicon layer is etched and thus a plurality of word lines 7 each having a gate electrode 7a are formed parallel to each other.

Then, using gate electrode 7 as a part of a mask, an impurity of a second conductivity type (for example, N type) is introduced by ion implantation in self-aligned manner, whereby a pair of source/drain regions 8 and 9 is formed.

Gate electrode 7a and a pair of source/drain regions 8 and 9 constitute a switching transistor of a memory cell. One of the source/drain regions 8, in this example, the source/drain region formed between adjacent gate electrodes 7a formed on the element forming region of the semiconductor substrate 1 serves as source/drain region of two switching transistors, and is connected to a bit line, which will be described later. The other one of the source/drain regions 9, in this example the source/drain region in contact with impurity layer 4, is connected to a storage node (which will be described later), which is one of the electrodes constituting a capacitive element of the memory cell.

Referring to FIG. 23, on the main surface of semiconductor substrate 1 and on word lines 7, an insulating layer 10 is formed by the CVD method, and a contact hole 10a is formed at a position of insulating layer 10 where one of the source/drain regions 8 is positioned. On insulating layer 10, a bit line 11 which is connected to one of the source/drain regions 8 through contact hole 10a is formed.

Then, referring to FIG. 24, an insulating layer 12 is formed by the CVD method on insulating layer 10 and bit line 11, and contact holes 12a and 10b are formed at positions of insulating layer 12 and 10 where the other one of the source/drain regions 9 is positioned. On insulating layer 11, a storage node 13 which is connected to the other one of the source/drain regions 9 through contact holes 12a and 10b is formed.

A dielectric film 14 is formed on storage node 13, and a cell plate 15 is formed on the entire surface of dielectric film 14. Storage node 13, dielectric film 14 and cell plate 15 formed in this manner constitute a capacitive element of the memory cell.

Thereafter, an insulating layer 16 is formed on cell plate 15 by the CVD method, and an interconnection layer 17 of aluminum opposing to word line 7 and electrically connected to the opposing word line 7 at a prescribed position is formed on insulating layer 16.

Thereafter, passivation film and the like are formed, thus completing a dynamic random access memory.

However, in the dynamic random access memory manufactured in this manner, impurity layer 4 in the element isolating structure involves crystal defects caused by ion implantation. When impurity layer 4 including crystal defects is in contact with the source/drain regions 8 and 9 of the switching transistor, leak current from source/drain regions 8 and 9 through impurity layer increases, resulting in degraded device characteristics such as degraded retention. Further, when more minute element isolating region is to be formed, the aspect ratio (ratio of the length and width of the total of opening 2a of insulating layer 2 and trench 3) at the time of ion implantation for forming impurity layer 4 is increased, and therefore control in forming impurity layer 4 becomes difficult.

SUMMARY OF THE INVENTION

An object of the present invention is to provide a method of forming element isolating region in a semiconductor device which can suppress undesirable influence on the characteristics of the semiconductor device derived from crystal defects generated during ion implantation.

Another object of the present invention is to provide a method of forming element isolating region in a semiconductor device in which an impurity layer for forming the element isolating region can be formed finely with superior control.

According to one aspect, the above described objects of the present invention can be attained by a method of forming an element isolating region in a semiconductor device including the steps of: forming a mask having an opening on element isolation forming region on a main surface of a semiconductor substrate; introducing an impurity of the same conductivity type as the semiconductor substrate from above the mask by ion-implantation and forming an impurity layer having a prescribed depth at the main surface of the semiconductor substrate at which the opening of the mask is positioned; forming a trench in the impurity layer, leaving the impurity layer in contact with the side surfaces and the bottom surface so that the impurity layer in contact with the side surfaces and the bottom surface serves as a channel stopper; and filling the trench with an insulating material. Accordingly, control in forming the impurity layer is easy and an impurity layer serving as a channel stopper including smaller number of crystal defects can be formed, and thus minute element isolation region can be obtained. Further, even when the source/drain regions of the MOS transistor is in contact with the impurity layer, leak current from the source/drain region through the impurity layer does not much increase, and thus degradation of the device characteristics such as retention can be prevented.

According to another aspect of the present invention, the above described objects can be attained by the method of forming an element isolating region in a semiconductor device comprising the steps of: forming a mask having an opening on an element isolation forming region on a main surface of a semiconductor substrate; introducing an impurity having the same conductivity type as the semiconductor substrate from above the mask by ion-implantation, and forming an ion-implanted impurity layer having a prescribed depth at the main surface of the semiconductor substrate where the opening of the mask is positioned; heat treating the semiconductor substrate in which ion-implanted impurity layer has been formed so as to form an impurity layer by diffusing the ions which has been introduced to the ion-implanted impurity layer; forming a trench at the ion-implanted impurity layer portion of the impurity layer, so that the impurity layer left in contact with the side surfaces and the bottom surface of the trench is used as a channel stopper; and filling the trench with an insulating material. Therefore, control in forming the impurity layer is easy, an impurity layer serving as a channel stopper not including crystal defect can be formed, and minute element isolating region can be obtained. Further, even when the source/drain regions of the MOS transistor is in contact with the impurity layer, leak current from the source/drain region through the impurity layer does not increase, and thus degradation of the device characteristics such as retention can be prevented.

According to a further aspect, the object of the present invention can be attained by the method of forming an element isolating region in a semiconductor device including the steps of: forming a mask consisting of an insulating film having an opening on an element isolation forming region on a main surface of a semiconductor substrate; forming a side spacer consisting of an insulating material different from the mask, in contact with an inner wall surface of the opening of the mask; introducing an impurity of the same conductivity type as the semiconductor substrate from above the mask and the side spacer by ion-implantation, thus forming an ion-implanted impurity layer having a prescribed depth at the main surface of the semiconductor substrate exposed through the mask and the side spacer; heat treating the semiconductor substrate in which the ion-implanted impurity layer has been formed, so that ions introduced to the ion-implanted impurity layer is diffused and an impurity layer is formed; removing the side spacer, forming a trench by etching the impurity layer on which the opening of the mask is positioned by using the mask, so that the impurity layer left in contact with the side surfaces and the bottom surface of the trench serves as a channel stopper; and filling the trench with an insulating material. Therefore, control in forming the impurity layer is easy and the impurity layer serving as a channel stopper in which crystal defect are more thoroughly removed can be obtained. Therefore, minute element isolating region can be obtained and even when the source/drain regions of the MOS transistor is contact with the impurity layer, for example, leak current from the source/drain region through the impurity layer does not increase, and thus degradation of device characteristics such as retention can be prevented.

According to a further aspect, the above described objects of the present invention can be attained by the method of forming an element isolating region in a semiconductor device including the steps of: forming a mask consisting of an insulating film having a first opening at an element isolation forming region, on a main surface of a semiconductor substrate; introducing an impurity of the same conductivity type as the semiconductor substrate from above the mask by ion-implantation, and forming an ion-implanted impurity layer having a prescribed depth at the main surface of the semiconductor substrate on which the first opening of the mask is positioned; heat treating the semiconductor substrate in which the ion-implanted impurity layer has been formed so as to diffuse ions introduced to the ion-implanted impurity layer and to form an impurity layer; forming a second opening by enlarging the first opening of the mask; forming a trench by etching the impurity layer at which the second opening of the mask is positioned, by using the mask, so that the impurity layer left in contact with the side surfaces and the bottom surface of the trench serves as a channel stopper; and filling the trench with an insulating material. Therefore, control in forming the impurity layer is easy and an impurity layer serving as a channel stopper from which crystal defects are more thoroughly removed can be formed. Thus a minute element isolating region can be obtained, even when the source/drain regions of the MOS transistor is in contact with the impurity layer, for example, leak current from the source/drain region through the impurity layer does not increase, and thus degradation of the device characteristics such as retention can be prevented.

According to a further aspect, the above described objects of the present invention can be attained by a method of forming an element isolating region in a semiconductor device including the steps of: forming a mask consisting of an insulating film having an opening on an element isolation forming region on a main surface of a semiconductor substrate; introducing an impurity of the same conductivity type as the semiconductor substrate from above the mask by ion-implantation, so as to form an impurity layer having a prescribed depth at the main surface of the semiconductor substrate on which the opening of the mask is positioned; after the formation of the impurity layer, forming a side spacer consisting of an insulating material different from that of the mask, in contact with an inner wall surface of the opening of the mask; forming a trench by etching exposed impurity layer using the mask and the side spacer so that the impurity layer left on the side surfaces and the bottom surface of the trench serves as a channel stopper; and filling the trench with an insulating material. Therefore, control in forming the impurity layer is easy and an impurity layer serving as a channel stopper including smaller number of crystal defects can be formed. Further, minute element isolating region can be obtained and even when the source/ drain regions of the MOS transistor is in contact with the impurity layer, for example, leak current from the source/drain region through the impurity layer does not much increase. Thus degradation of device characteristics such as retention can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A first embodiment of the present invention which is applied to element isolation at a memory cell portion of a dynamic random access memory, will be described with reference to FIGS. 1 to 8.

Figure 1:
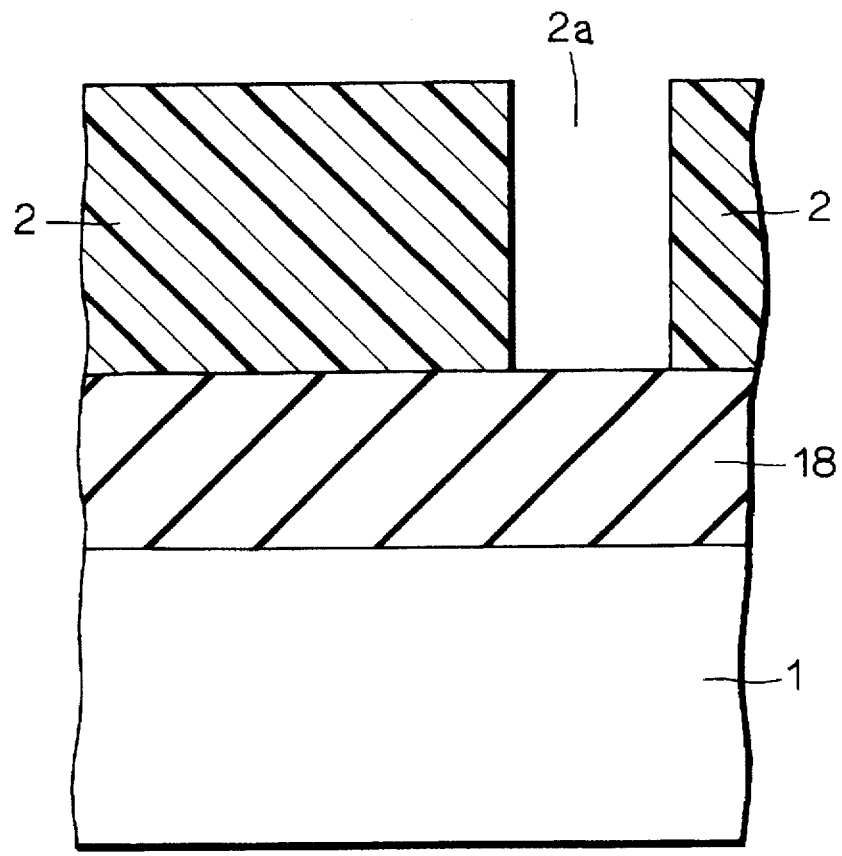
FIGS. 1 to 8 are cross sections of a main portion showing a first embodiment of the present invention in order of manufacturing steps.

First, referring to FIG. 1, on a main surface of a semiconductor substrate 1 formed of a silicon substrate of a first conductivity type (for example, P type) having the impurity concentration of about $1 \times 10^{15}$ cm$^{-3}$ to $1 \times 10^{16}$ cm$^{-3}$, an insulating film 18 formed of a silicon oxide film ($SiO_2$), silicon nitride film ($Si_3N_4$) or the like is formed by the CVD method. The thickness of insulating film 18 is set to be approximately the same as the depth of a trench, which is formed later and consisting the element isolation region, that is, about 0.1 μm, for example. Insulating film 18 is used as a mask for framing an impurity layer and a trench constituting the element isolation region, which will be formed later. Further, this insulating film 18 does not present any problem in heat treatment for forming the impurity layer.

Thereafter, a resist layer 2 is formed on the entire surface of insulating film 18, and an opening 2a is formed in resist layer 2. Opening 2a of resist layer 2 is formed at a position of semiconductor substrate 1 where element isolation forming region surrounding element forming region of semiconductor substrate 1 is positioned, and the width of opening is about 0.1 μm to 1 μm, for example.

Figure 2:
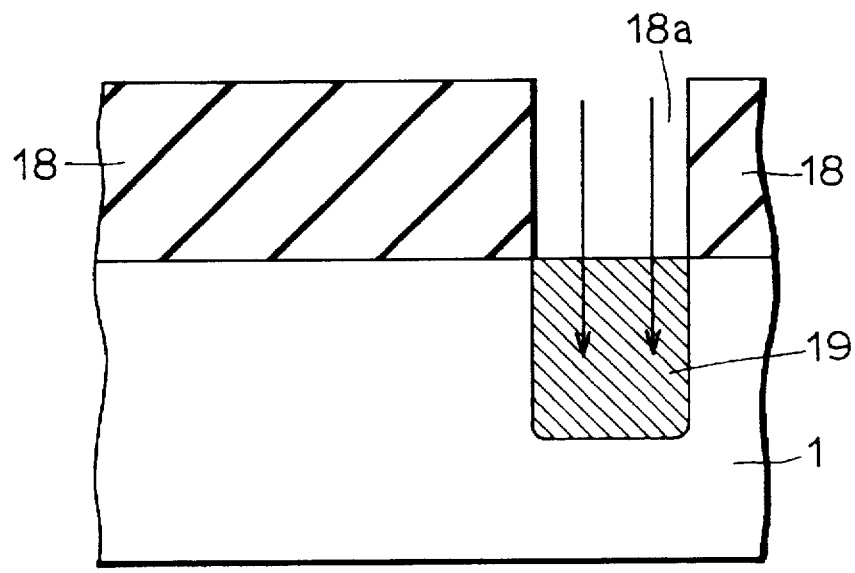

Thereafter, referring to FIG. 2, using resist layer 2 having opening 2a as a mask, insulating film 18 exposed at opening 2a is etched by conventional etching technique, and an opening 18a is formed at a portion of semiconductor substrate 1 on which element isolation forming region is positioned. Thereafter, resist 2 is removed. At this time, the width of opening 18a of insulating film 18 is the same as that of resist film 2, that is, about 0.1 μm to 1 μm, for example.

Thereafter, using insulating film 18 having opening 18a as a mask, an impurity of a first conductivity type (for example, boron (B) when P type is used, and phosphorus (P) or arsenic (As) when N type is used) is introduced by ion implantation, and ion implanted impurity layer 19 is formed on the main surface of the semiconductor substrate 1 exposed at opening 18a. The width of the ion-implanted impurity layer 19 is regulated by the width of opening portion 18a and therefore it is the same as that of opening 18a, for example about 0.1 μm to 1 μm. The width thereof is approximately the same as the width of the trench constituting the element isolating region, which will be formed later, for example about 0.1 μm.

Figure 3:
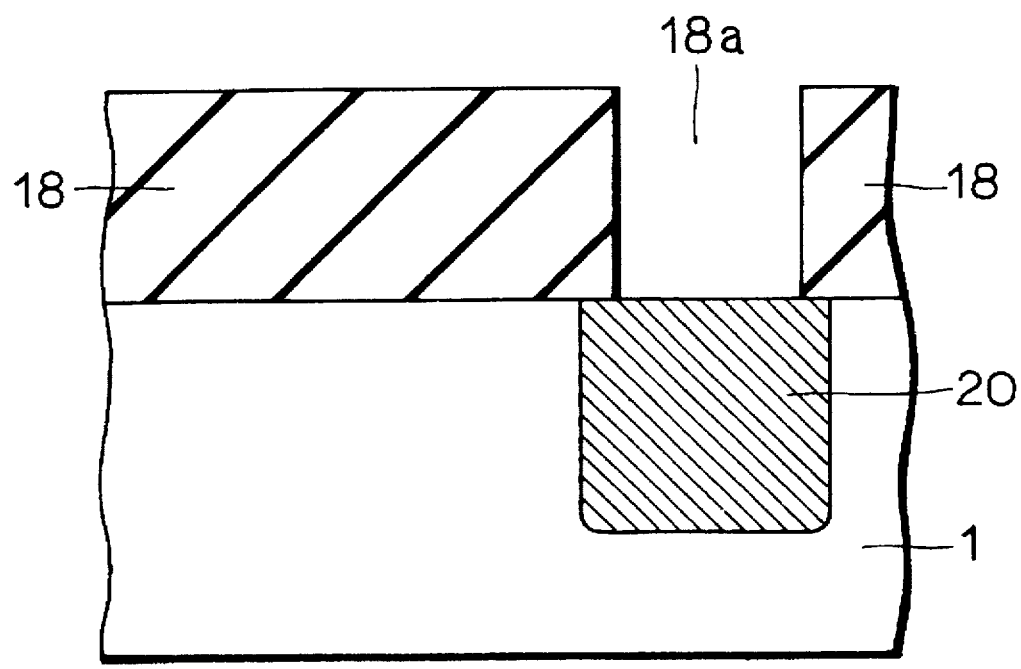

Thereafter, referring to FIG. 3, semiconductor substrate 1 in which ion-implanted impurity layer 19 is formed is heat-treated, whereby ions introduced to the ion-implanted impurity layer 19 are diffused, and thus an impurity layer 20 is formed. This heat treatment is carried out at a temperature, for example, of 750° to 1180° C. so that peak impurity concentration of the portion of the impurity layer 20 to which impurity is diffused from the ion-implanted impurity layer 19 attains $1 \times 10^{17}$ cm$^{-3}$ to $1 \times 10^{18}$ cm$^{-3}$. The portion of the impurity layer 20 to which impurity is diffused from ion-implanted impurity layer 19 has the width of about several tenth μm to 1 μm from the portion of the ion-implanted impurity layer 19.

Though crystal defects generated by ion implantation are included in the ion-implanted impurity layer 19 in the impurity layer 20, there is not a crystal defect at the portion of impurity layer 20 to which impurity is diffused from ion-implanted impurity layer 19 by the heat treatment.

Figure 4:
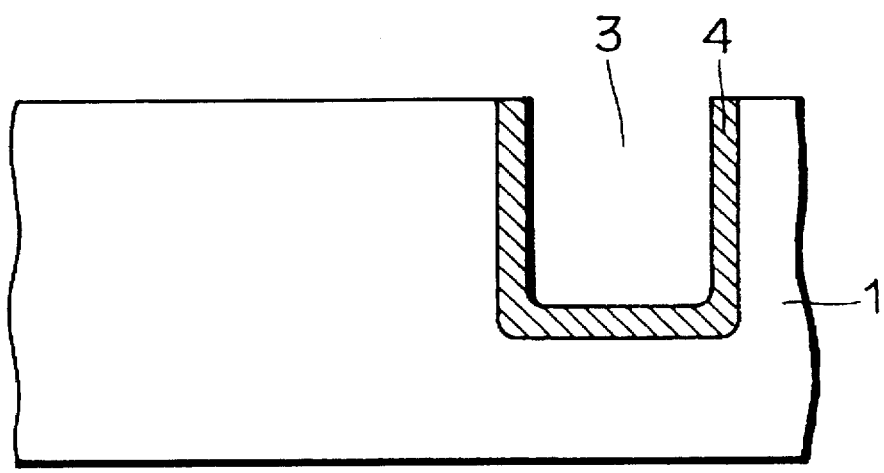

As shown in FIG. 4, by using insulating film 18 as a mask, the main surface of semiconductor substrate 1 is etched by the conventional etching technique (anisotropic etching), and a trench 3 is formed in the element isolation forming region of semiconductor substrate 1 with the impurity layer 4 left on the side surfaces and the bottom surface. The trench 3 has its width regulated by the width of opening 18a of insulating film 18, and therefore it is the same as the width of opening 18a, that is, about 0.1 μm to 1 μm, while its depth is about 0.1 μm.

As the trench 3 is formed in this manner, the ion-implanted impurity layer 19 in the impurity layer 20, that is, the portion to which ion is introduced by ion implantation before heat treatment (including crystal defects) can be removed completely in self aligned manner, and the portion of the impurity layer 20 to which impurity is diffused from the ion-implanted impurity layer 19 (where crystal defects do not exist) is left as the impurity layer 4 (functioning as a channel stopper) for isolating elements on the side surfaces and bottom surface of trench 3. Impurity layer 4 serving as the channel stopper has the width of several tenth μm to 1 μm from the inner wall surface (side surface or bottom surface) of the trench 3.

Figure 5:
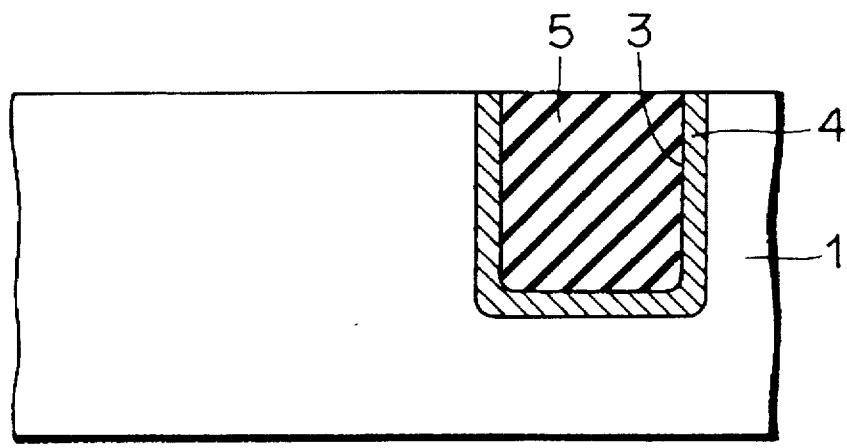

After trench 3 is formed in this manner, insulating film 18 is removed and an insulating layer such as silicon oxide film ($SiO_2$) or silicon nitride film ($Si_3N_4$) is formed by the CVD method on the main surface and in the trench of semiconductor substrate 1, as shown in FIG. 5. Thereafter, the insulating layer is etched back so that the insulating layer on the main surface of the semiconductor substrate 1 is removed completely, and buried insulating layer 5 is formed only in trench 3.

The element isolation region surrounding the element forming region of semiconductor substrate 1 is provided by the trench 3, impurity layer 4 and buried insulating layer 5 formed in this manner.

Figure 6:
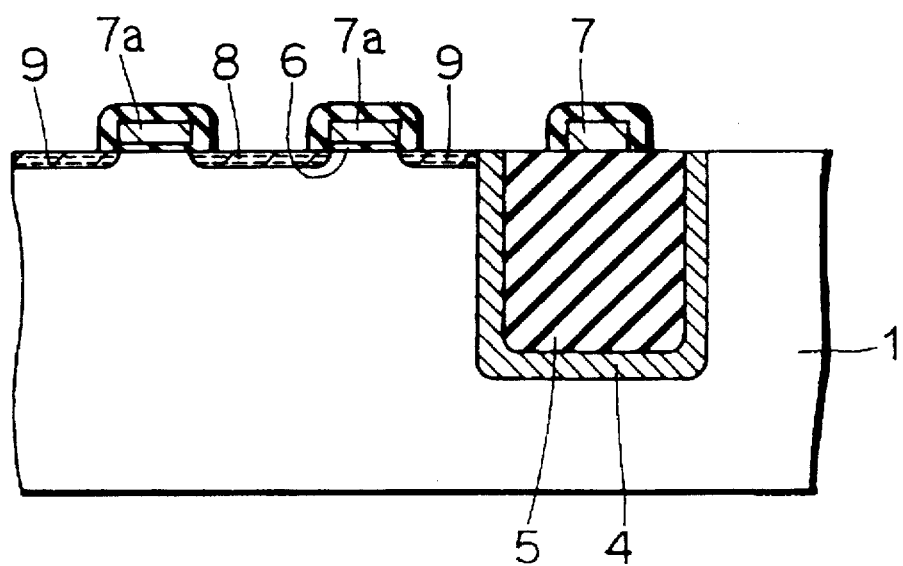

Thereafter, a gate insulating film 6 of silicon oxide film (SiO$_2$) is formed on the buried insulating layer 5 and on the main surface of semiconductor substrate 1 as shown in FIG. 6, a polycrystalline silicon layer is formed on gate insulating film 6, and the polycrystalline silicon layer is etched so as to form a plurality of word lines 7 having gate electrodes 7a parallel to each other.

The width of the word line 7 is set to be several tenth μm to about 1 μm, so that it is surely smaller in width than the width of trench 3.

Thereafter, by using gate electrode 7 as a part of the mask, an impurity of a second conductivity type (for example, N type) is introduced by ion implantation in self aligned manner, so as to form a pair of source/drain regions 8 and 9.

The gate electrode 7a and a pair of source/drain regions 8 and 9 constitute a switching transistor of a memory cell. One of the source/drain regions 8, in this example the source/drain region formed between gate electrodes 7a formed adjacent to each other on the element forming region of semiconductor substrate 1 serves as the source/drain region of two switching transistors and connected to a bit line, which is described later. The other one of the source/drain regions 9, in this example the source/drain region in contact with impurity layer 4, is connected to a storage node (which will be described later) which is one of the electrodes constituting a capacitive element of the memory cell.

Figure 7:
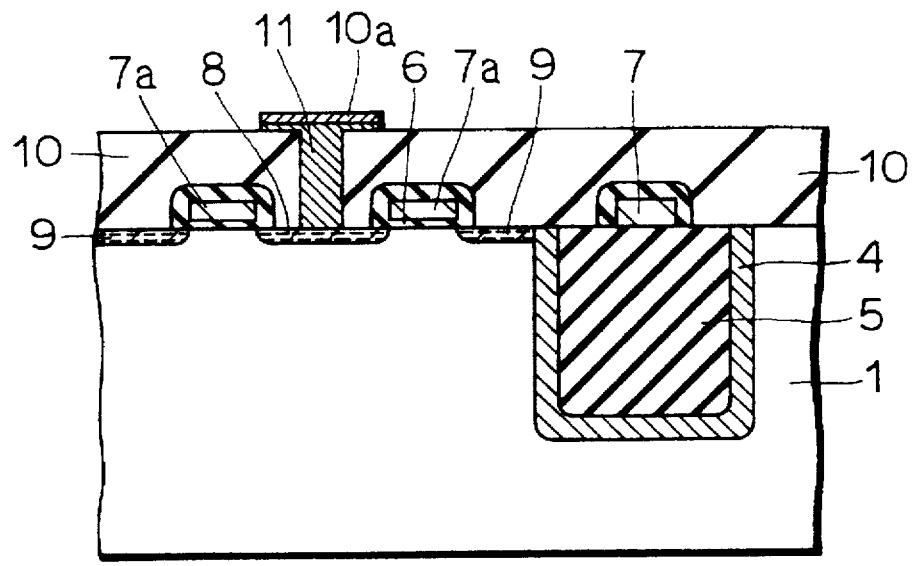

Referring to FIG. 7, an insulating layer 10 is formed by the CVD method on the word line 7 and the main surface of semiconductor substrate 1, and a contact hole 10a is formed at a portion of insulating layer 10 where one of the source/drain regions 8 is positioned. On insulating layer 10, bit line 11 which is connected to one of the source/drain regions 8 through contact hole 10a is formed.

Figure 8:
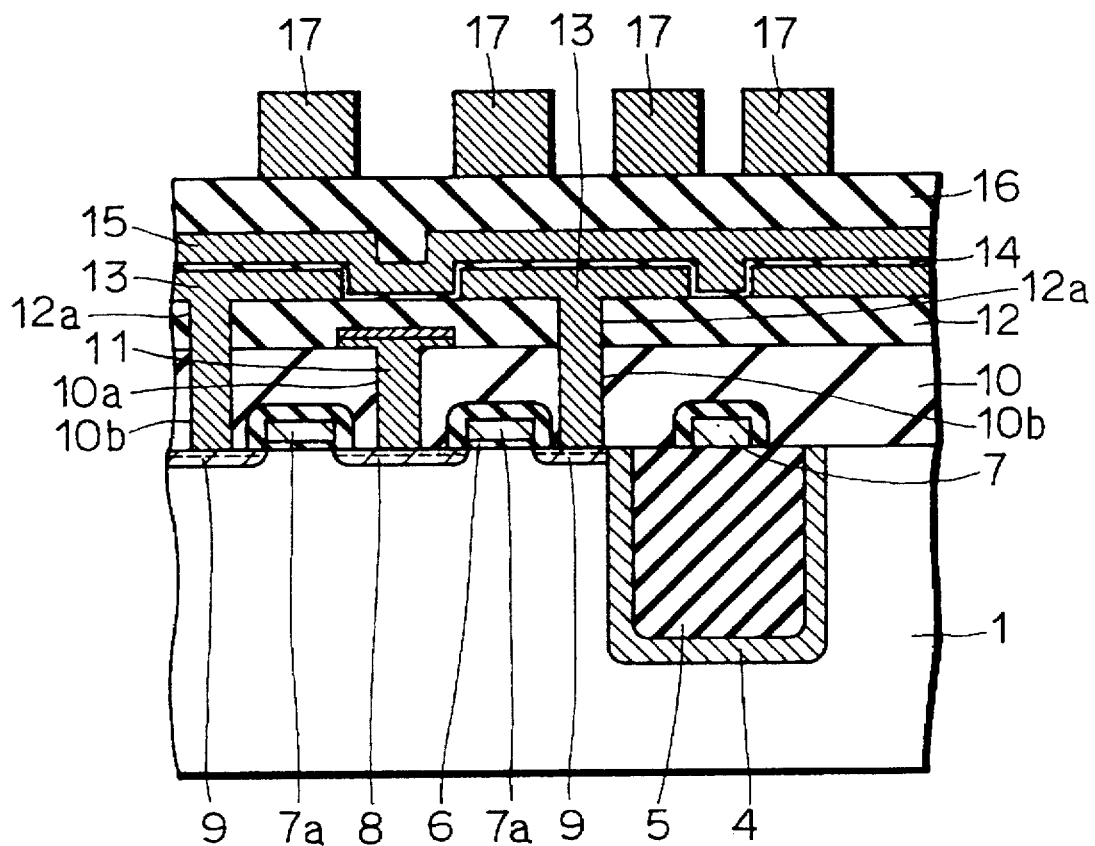

Then, referring to FIG. 8, an insulating layer 12 is formed by the CVD method on insulating layer 10 and bit line 11, and contact holes 12a and 10b are formed at a portion of insulating layer 12 and insulating layer 10 where the other one of the source/drain region 9 is positioned. A storage node 13 which is connected to the other one of the source/drain region 9 through contact holes 12a and 10b is formed on insulating layer 11.

A dielectric film 14 is formed on storage node 13, and a cell plate 15 is formed on the entire surface of dielectric film 14.

Storage node 13, dielectric film 14 and cell plate 15 formed in this manner constitute a capacitive element of the memory cell.

Thereafter, an insulating layer 16 is formed by the CVD method on cell plate 15, and an interconnection layer 17 of aluminum opposing to a word line 7 and electrically connected to the opposing word line 7 at a prescribed position is formed on insulating layer 16.

Thereafter, passivation film and so on are formed, thus completing a dynamic random access memory.

In such a structure, since the impurity layer 4 serving as a channel stopper is provided by forming a trench 3 in an impurity layer 20 formed by ion implantation and thermal diffusion of impurity to the main surface of semiconductor substrate 1. Since oblique ion implantation or the like is not necessary, control is easier, and minute element isolating region can be formed.

Further, since crystal defects caused by ion implantation carried out for forming the impurity layer 4 is all removed by the provision of trench 3, the impurity layer 4 is devoid of any crystal defect, and therefore even when it is in contact with the source/drain regions 8 and 9 of the switching transistor, leak current from the source/drain regions 8 and 9 through impurity layer 4 does not increase, and thus device characteristics such as retention are not degraded.

Second Embodiment

FIGS. 9 to 12 show the second embodiment of the present invention, which will be described in the following.

In the similar manner as in the first embodiment described above, an insulating film 18 such as silicon oxide film (SiO$_2$) or silicon nitride film (Si$_3$N$_4$) is formed by the CVD method on the main surface of semiconductor substrate 1, a resist layer 2 is formed on the entire surface of insulating film 18, and an opening 2a is formed in resist layer 2. By using resist layer 2 having opening 2a as a mask, insulating film 18 exposed through opening 2a is etched by conventional etching technique, thus forming an opening 18a at a portion of semiconductor substrate 1 where an element isolation forming region is positioned. Thereafter resist layer 2 is removed. At this time, the width of opening 18a of insulating film 18 is the same as the opening of resist layer 2, that is, about 0.3 μm to 1 μm, for example.

Figure 9:
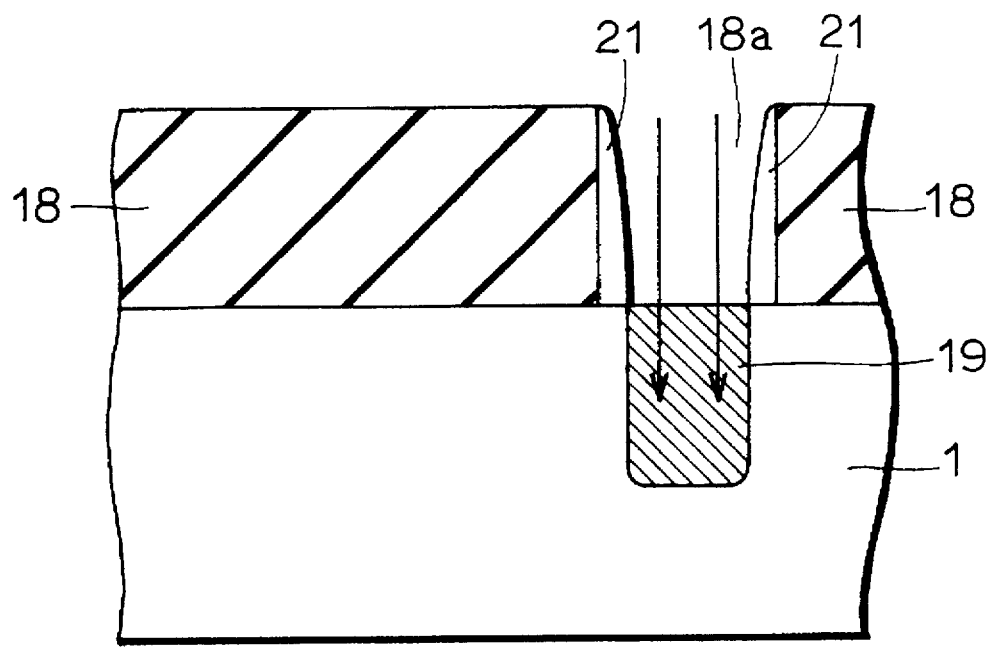
FIGS. 9 to 12 are cross sections of a main portion showing a second embodiment of the present invention in order of the manufacturing steps.

Referring to FIG. 9, an insulating layer such as silicon oxide film (SiO$_2$) or silicon nitride film (Si$_3$N$_4$) different from the material of the insulating film 18 (that is, when insulating film 18 is silicon oxide, silicon nitride film), is formed by the CVD method on the surface of insulating film 18 to the thickness of about 0.1 μm, for example. This insulating layer is etched back by anisotropic etching, so that the insulating layer on the surface of insulating film 18 is completely removed, and side spacers 21 are formed in the opening 18a of insulating film 18. The width of side spacer 21 which is in contact with semiconductor substrate 1 is the same as the depth of original deposition, that is, about 0.1 μm, for example.

Thereafter, by using insulating film 18 having opening 18a and side spacers 21 as a mask, an impurity of the first conductivity type is introduced by ion implantation, so that an ion-implanted impurity layer 19 is formed at the main surface of semiconductor substrate exposed through opening 18a and side spacers 21. The ion-implanted impurity layer 19 has its width regulated by the width of side spacers 21 and opening 18a of insulating film 18, and therefore it is about 0.1 μm to 0.8 μm. The depth of this layer 19 is approximately the same as the depth of the trench constituting the element isolating region which will be formed later, for example about 0.1 μm.

Figure 10:
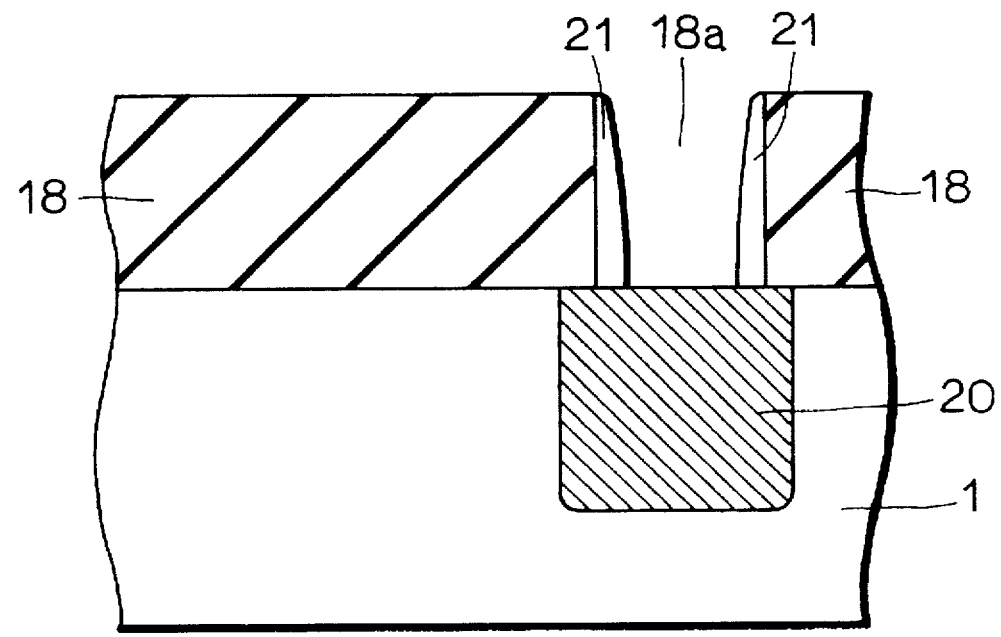

Then, referring to FIG. 10, the semiconductor substrate 1 in which ion-implanted impurity layer 19 has been formed is heat treated, so that ions introduced to ion-implanted impurity layer 19 is diffused and an impurity layer 20 is formed. This heat treatment is performed at a temperature of 750° to 1180° C. for example, so that peak impurity concentration of the portion of impurity layer 20 to which impurity is diffused from ion-implanted impurity layer 19 attains $1 \times 10^{17}$ cm$^{-3}$ to $1 \times 10^{18}$ cm$^{-3}$, for example. The portion of impurity layer 20 to which impurity is diffused from ion-implanted impurity layer 19 has the width of about several tenth μm to about 1 μm from the ion-implanted impurity layer 19.

Though ion-implanted impurity layer 19 of impurity layer 20 includes crystal defects generated by ion implantation, the portion of impurity layer 20 to which impurity is diffused from ion-implanted impurity layer 19 is free from crystal defects.

Figure 11:
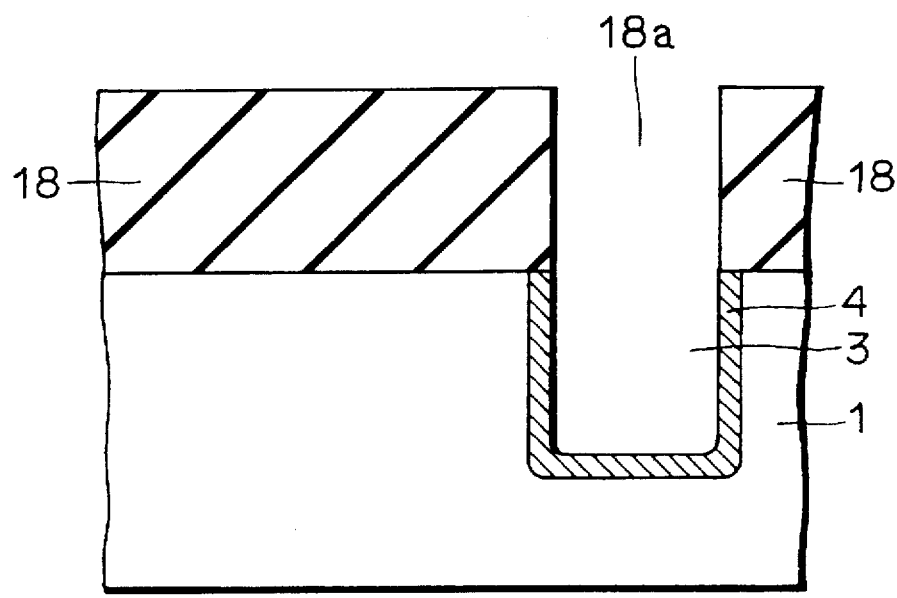

Referring to FIG. 11, side spacers 21 are removed, the main surface of semiconductor substrate 1 is etched by conventional etching technique (anisotropic etching) by using insulating film 18 as a mask, and a trench 3 is formed in the element isolation forming region of semiconductor substrate 1, with the impurity left on the side surfaces and bottom surface. The trench has its width regulated by the width of opening 18a of insulating film 18 and therefore it is the same as the width of opening 18a, for example, about 0.3 μm to 1 μm. The depth of the trench is about 0.1 μm, for example. Since trench 3 is formed in this manner, the portion of ion-implanted impurity layer 19 of impurity layer 20, that is, the portion to which ions are introduced by ion implantation prior to heat treatment (including crystal defects) can be completely removed in self aligned manner, and the portion of impurity layer 20 to which impurity is diffused from ion-implanted impurity layer 19 (where there is no crystal defect) is left on the side surfaces and on the bottom surface of trench 3 as impurity layer 4 for element isolation (which serves as channel stopper). The impurity layer 4 serving as the channel stopper has the width of about several tenth μm to about 1 μm from the inner wall surface (wall surface of the side surfaces and bottom surface) of trench 3.

After trench 3 is formed in this manner, insulating film 18 is removed, and buried insulating layer 5 is formed in trench 3 of semiconductor substrate 1 in the similar manner as shown in FIGS. 5 to 7 of the first embodiment, thus providing an element isolating region surrounding the element forming region of semiconductor substrate 1 constituted by trench 3, impurity layer 4 and buried insulating layer 5. Thereafter, gate insulating film 6, word line 7 having gate electrode 7a, a pair of source/drain regions 8 and 9, and a bit line 11 are formed.

Figure 12:
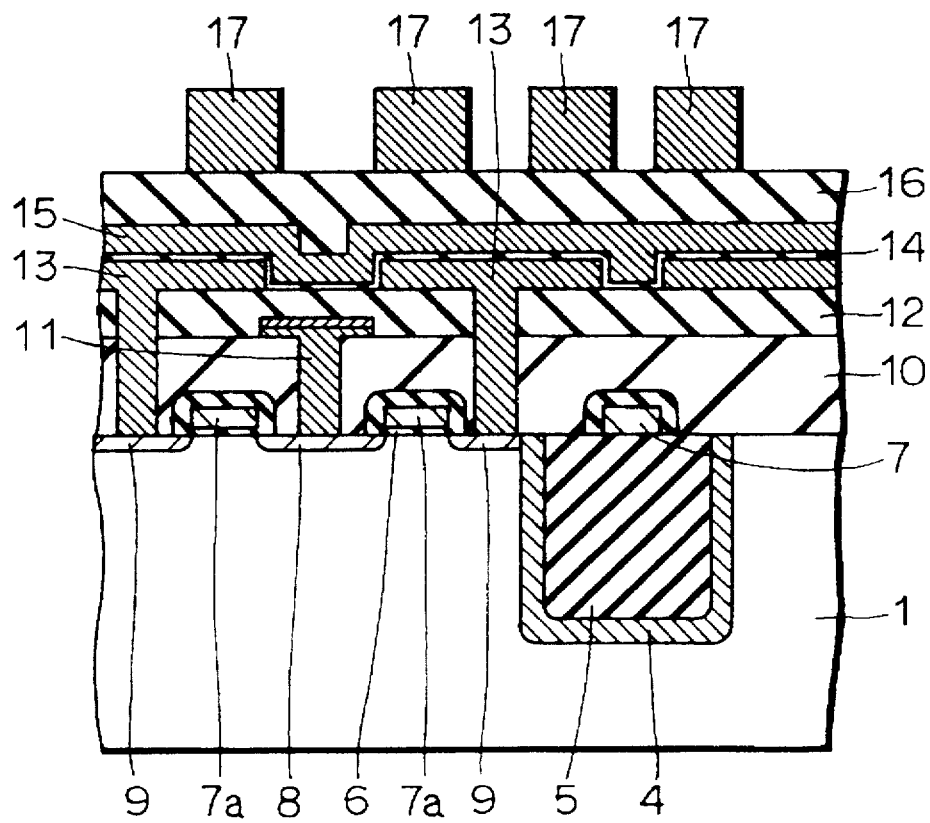

Thereafter, referring to FIG. 12, in the similar manner as shown in FIG. 8 of the first embodiment, insulating layer 12, storage node 13, dielectric film 14, cell plate 15, insulating layer 16 and interconnection layer 17 are formed. Thereafter, passivation film and the like are formed, thus completing a dynamic random access memory.

In this structure also, as in the first embodiment, the impurity layer 4 serving as the channel stopper can be formed with easier control, and minute element isolation region can be provided.

Further, since ion-implanted impurity layer 19 is formed by using side spacers 21, impurity layer 20 is formed and then trench 3 is formed after removing side spacers 21, crystal defects caused by ion implantation carried out for forming the impurity layer 4 can be more thoroughly removed by the trench 3. Therefore, there is not a crystal defect in impurity layer 4. Therefore, even when it is in contact with the source/drain regions 8 and 9 of the switching transistor, leak current from source/drain regions 8 and 9 through impurity layer 4 does not increase, and therefore device characteristics such as retention are not degraded.

Third Embodiment

Figure 13:
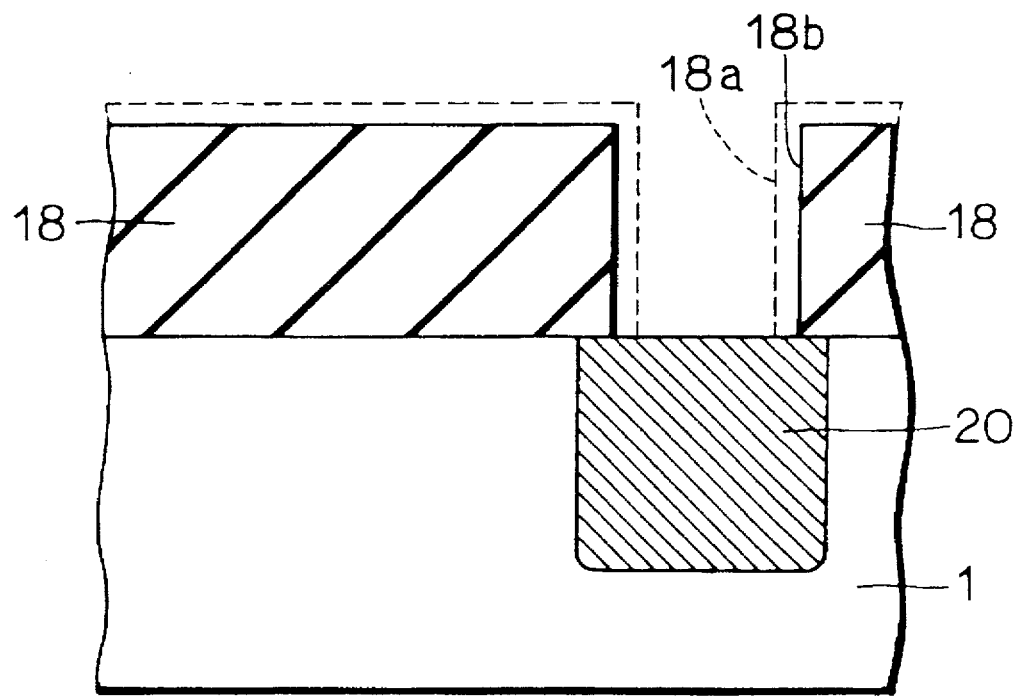
FIGS. 13 to 15 are cross sections of a main portion showing a third embodiment of the present invention in order of manufacturing steps.
Figure 14:
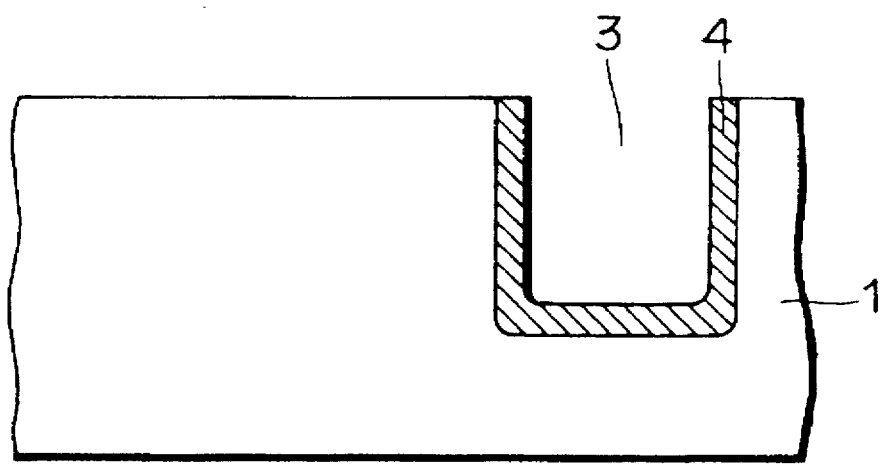
Figure 15:
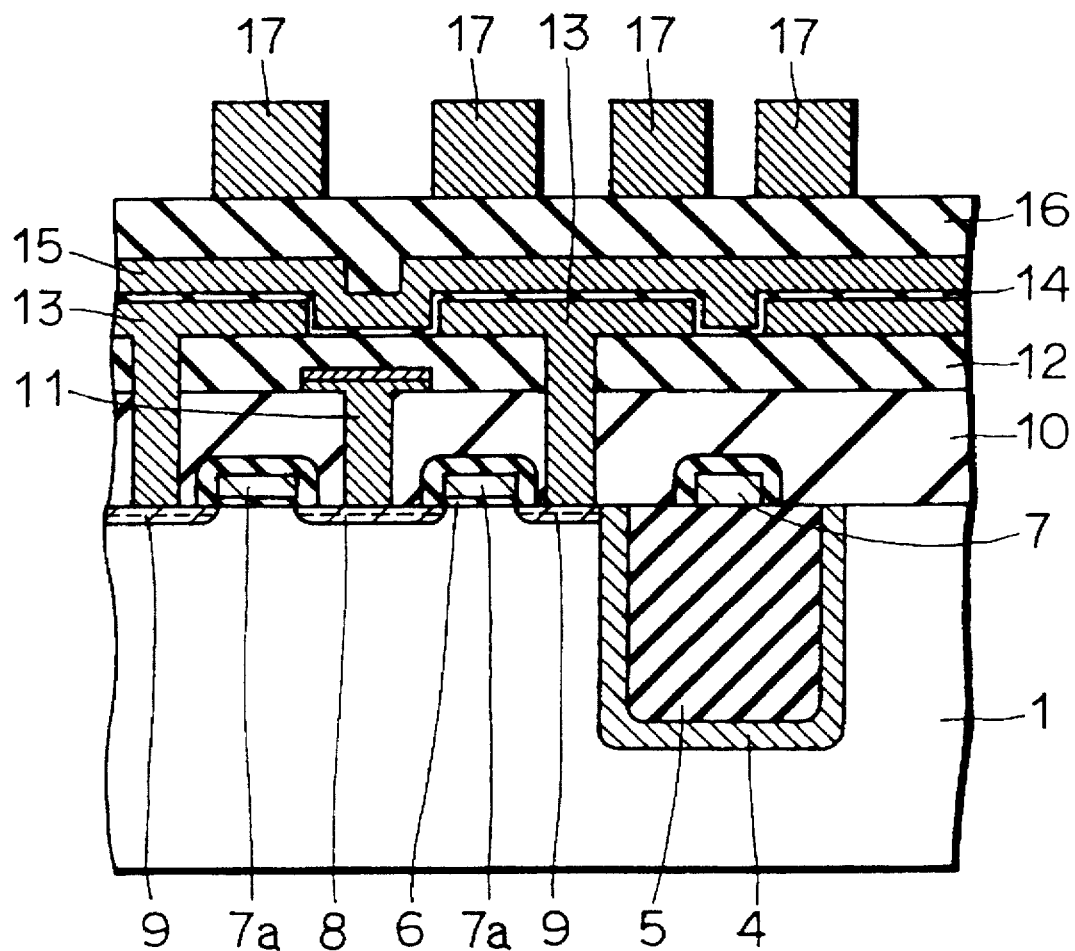

FIGS. 13 to 15 show the third embodiment of the present invention, which will be described in the following.

First, in the similar manner as shown in FIGS. 1 to 3 of the first embodiment described above, an insulating film 18 such as silicon oxide film ($SiO_2$) or silicon nitride film ($Si_3N_4$) is formed by the CVD method on the main surface of semiconductor substrate 1. Thereafter, resist layer 2 is formed on the entire surface of insulating film 18, and an opening 2a is formed in resist layer 2. By using resist layer 2 having opening 2a as a mask, insulating film 18 exposed through opening 2a is etched by the conventional etching technique so that an opening 18a is formed at a portion of semiconductor substrate 1 on which the element isolation forming region is positioned. Then resist layer 2 is removed. At this time, the width of opening 18a of insulating film 18 is the same as the width of opening of resist layer 2, that is, about 0.1 μm to 1 μm, for example.

By using insulating film 18 having opening 18a as a mask, an impurity of the first conductivity type is introduced by ion-implantation, and ion-implanted impurity layer 19 is formed on the main surface of semiconductor substrate 1 exposed through opening 18a. The ion-implanted impurity layer 19 has its width regulated by the width of opening 18a of insulating film 18, that is, about 0.1 μm to 1 μm. The width is approximately the same as the depth of the trench constituting the element isolating region which will be formed later, that is, about 0.1 μm.

Thereafter, semiconductor substrate 1 in which ion-implanted impurity layer 19 is formed is heat treated, so that ions introduced in ion-implanted impurity layer 19 is diffused to form impurity layer 20. This heat treatment is performed at a temperature of, for example, 750° to 1180° C., so that peak impurity concentration of the portion of impurity layer 20 to which impurity is diffused from ion-implanted impurity layer 19 attains about $1 \times 10^{17}$ $cm^{-3}$ to $1 \times 10^{18}$ $cm^{-3}$. Further, the portion of impurity layer 20 to which impurity is diffused from ion-implanted impurity layer 19 has the width of several tenth μm to 1 μm from the portion of ion-implanted impurity layer 19.

Though crystal defects caused by ion implantation are included in ion-implanted impurity layer 19 of impurity layer 20, there is not a crystal defect of the portion of impurity layer 20 to which impurity is diffused from ion-implanted impurity layer 19.

Then, referring to FIG. 13, isotropic etching is performed on the entire surface of insulating film 18 so as to enlarge opening 18a of insulating film 18 to 18b. The amount of etching in accordance with isotropic etching at this time is about 0.1 μm, so that the width of opening 18b is about 0.3 μm to 1.2 μm, for example.

By using insulating film 18 having opening 18b formed in this manner as a mask, the main surface of semiconductor substrate 1 is etched by a conventional etching technique (anisotropic etching), and at the element isolation forming region of semiconductor substrate 1, a trench 3 is formed with the impurity layer 4 in contact with the side surfaces and a bottom surface left thereon, as shown in FIG. 14. The trench 3 has its width regulated to the width of opening 18b of insulating film 18 and therefore it is the same as the width of opening 18b, that is, about 0.3 μm to 1 μm, and the depth is about 0.1 μm.

Since trench 3 is formed in this manner, ion-implanted impurity layer 19 of impurity layer 20, that is, the portion to which ions are introduced by ion implantation prior to heat treatment (which means that crystal defects are included) can be completely removed in self aligned manner, and the portion of impurity layer 20 to which impurity is diffused from ion-implanted impurity layer 19 (which means that there is not a crystal defect) is left as the impurity layer 4 (serving as the channel stopper) for element isolation, is left on the side surfaces and bottom surface of trench 3. The impurity layer 4 serving as the channel stopper has the width of several tenth to about 1 μm, for example, from the inner wall surface (side surfaces and bottom surface) of trench 3.

After trench 3 is formed in this manner, insulating film 18 is removed, and in the similar manner as described with reference to FIGS. 5 to 7 of the first embodiment, buried insulating layer 5 is formed in the trench of semiconductor substrate 1. Thus an element isolating region surrounding the element forming region of semiconductor substrate 1, constituted by trench 3, impurity layer 4 and buried insulating layer 5 is formed. Thereafter, gate insulating film 6, word line 7 having gate electrode 7a, a pair of source/drain regions 8 and 9, and bit line 11 are formed.

Thereafter, referring to FIG. 15, in the similar manner as shown in FIG. 8 of the first embodiment, insulating layer 12, storage node 13, dielectric film 14, cell plate 15, insulating layer 16 and interconnection layer 17 are formed.

Thereafter, passivation film and the like are formed, thus completing dynamic random access memory.

In this structure also, as in the first embodiment described above, impurity layer 4 serving as the channel stopper can be formed with easy control, and minute element isolating region can be provided.

Further, since ion-implanted impurity layer 19 is formed through opening 18a, the impurity is diffused to form impurity layer 20, and trench 3 is formed by using wider opening 18b than the opening 18a, crystal defects generated by ion implantation performed for forming impurity layer 4 can be more definitely and completely removed by trench 3, so that crystal defect does not exist at all in impurity layer 4. Even when it is in contact with the source/drain regions 8 and 9 of the switching transistor, leak current from the source/drain regions 8 and 9 through the impurity layer 4 does not increase, and therefore device characteristics such as retention are not degraded.

Fourth Embodiment

Figure 16:
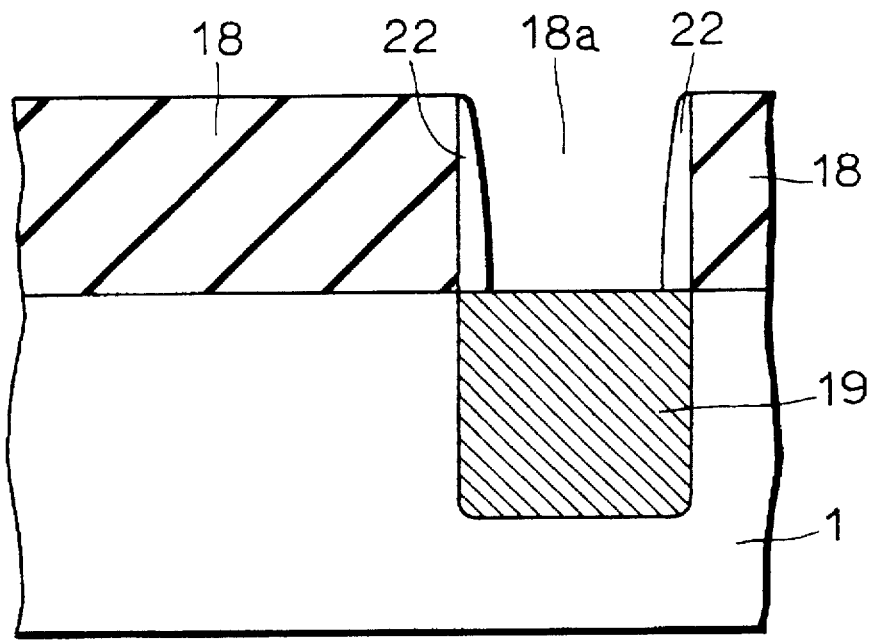
FIGS. 16 to 18 are cross sections of a main portion showing a fourth embodiment of the present invention in order of manufacturing steps.
Figure 17:
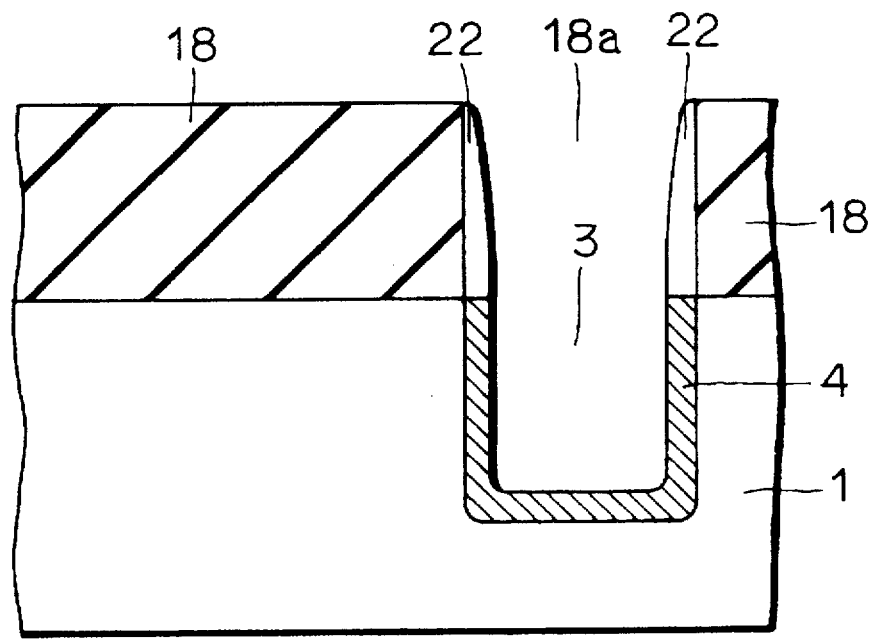
Figure 18:
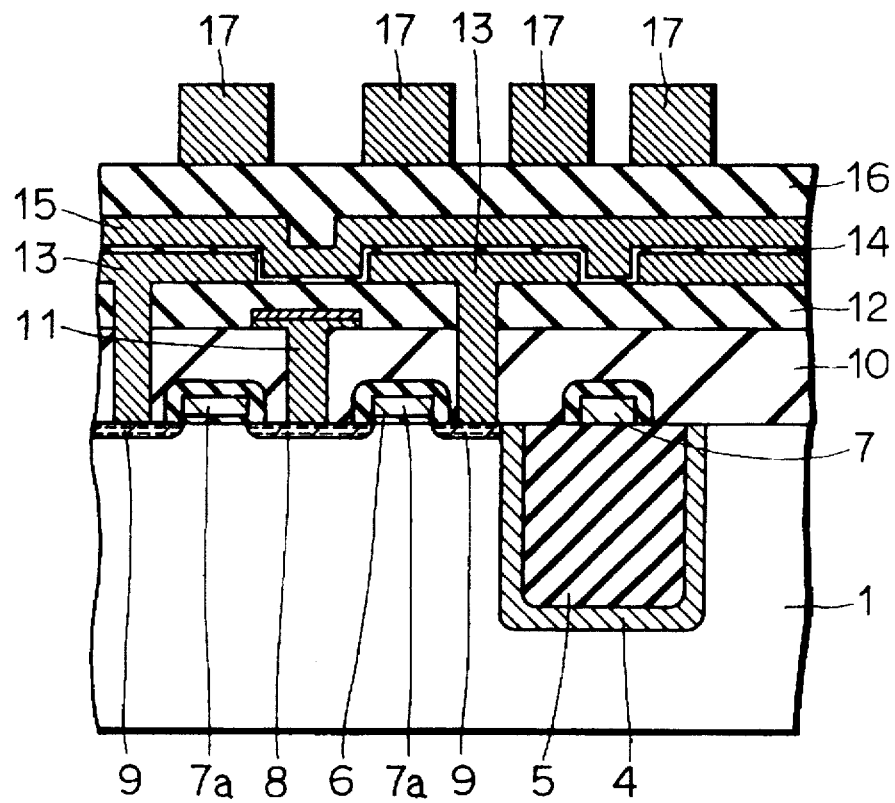
Figure 19:
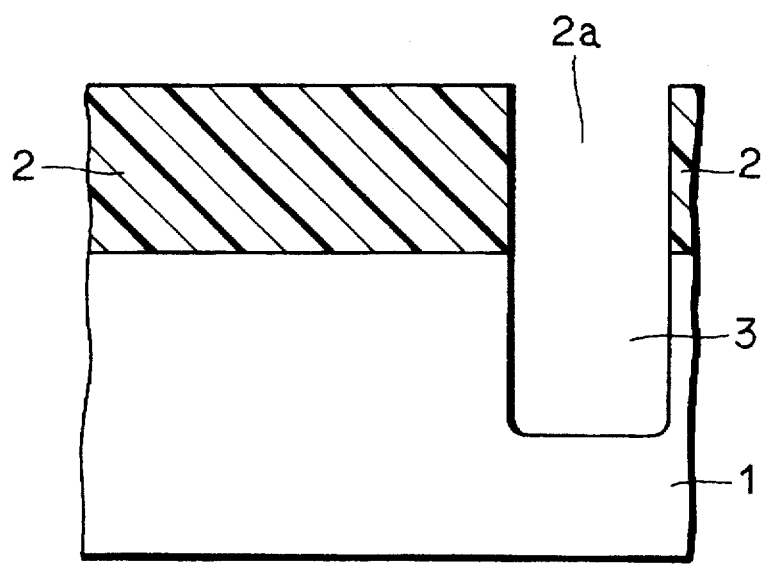
FIGS. 19 to 24 are cross sections of a main portion showing a modification in which trench isolation is applied to element isolating region, in order of manufacturing steps.
Figure 20:
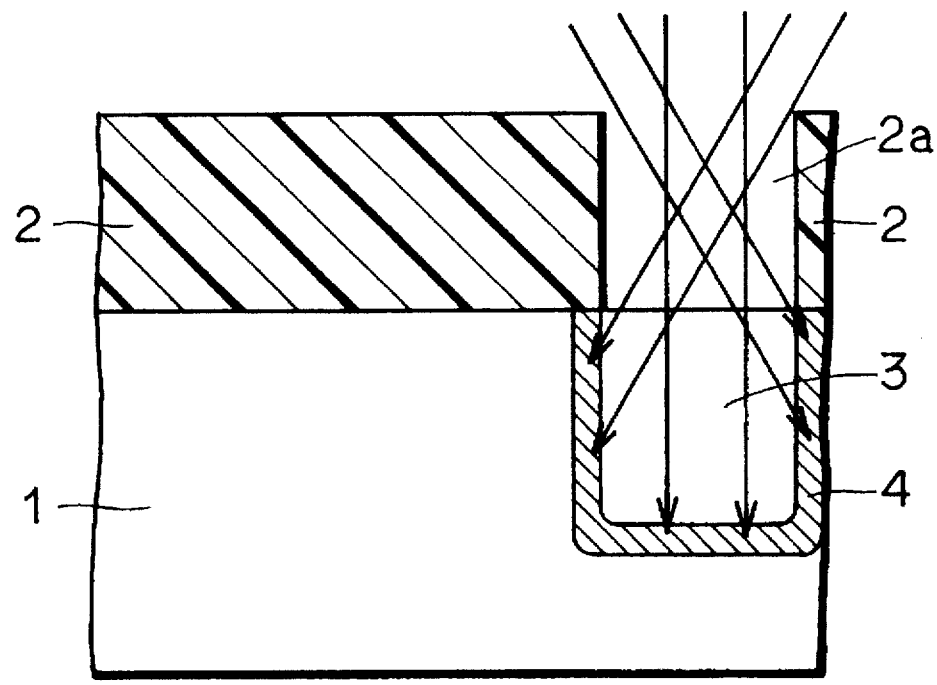
Figure 21:
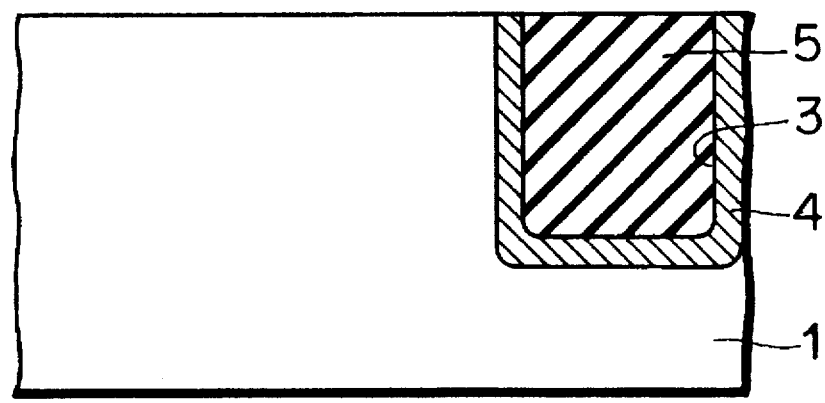
Figure 22:
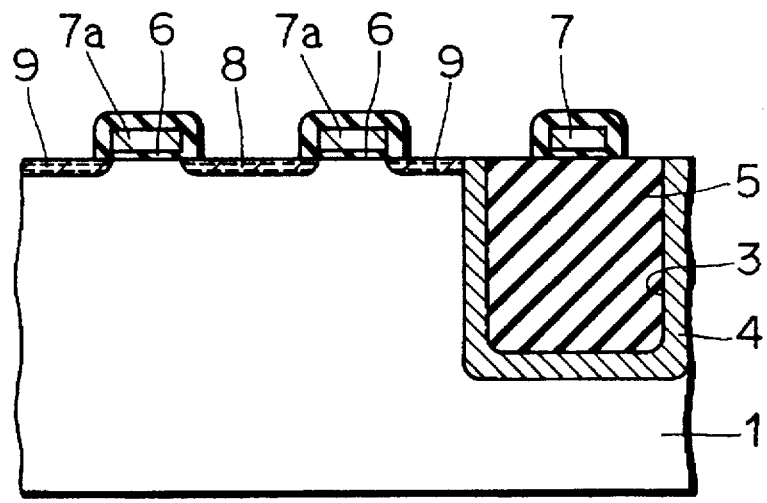
Figure 23:
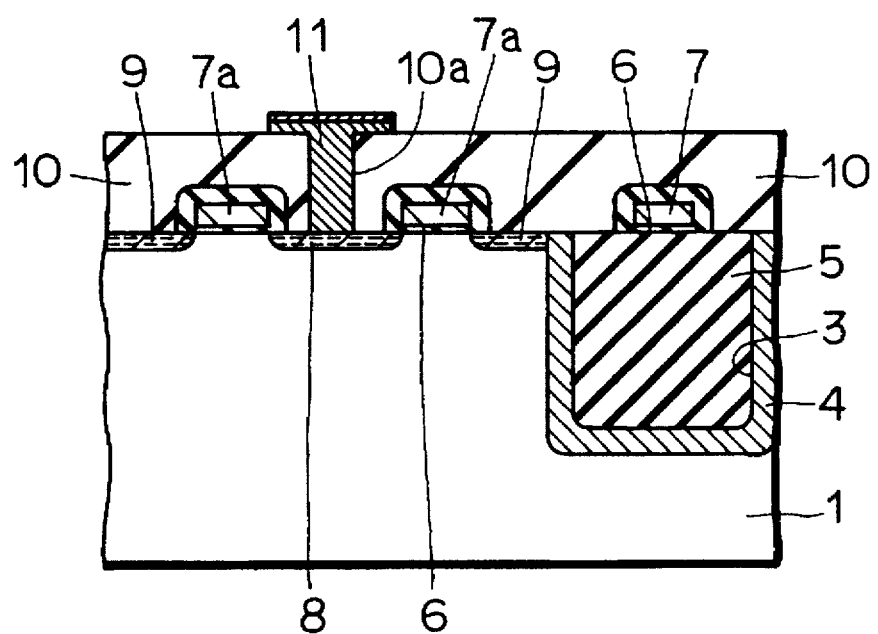
Figure 24:
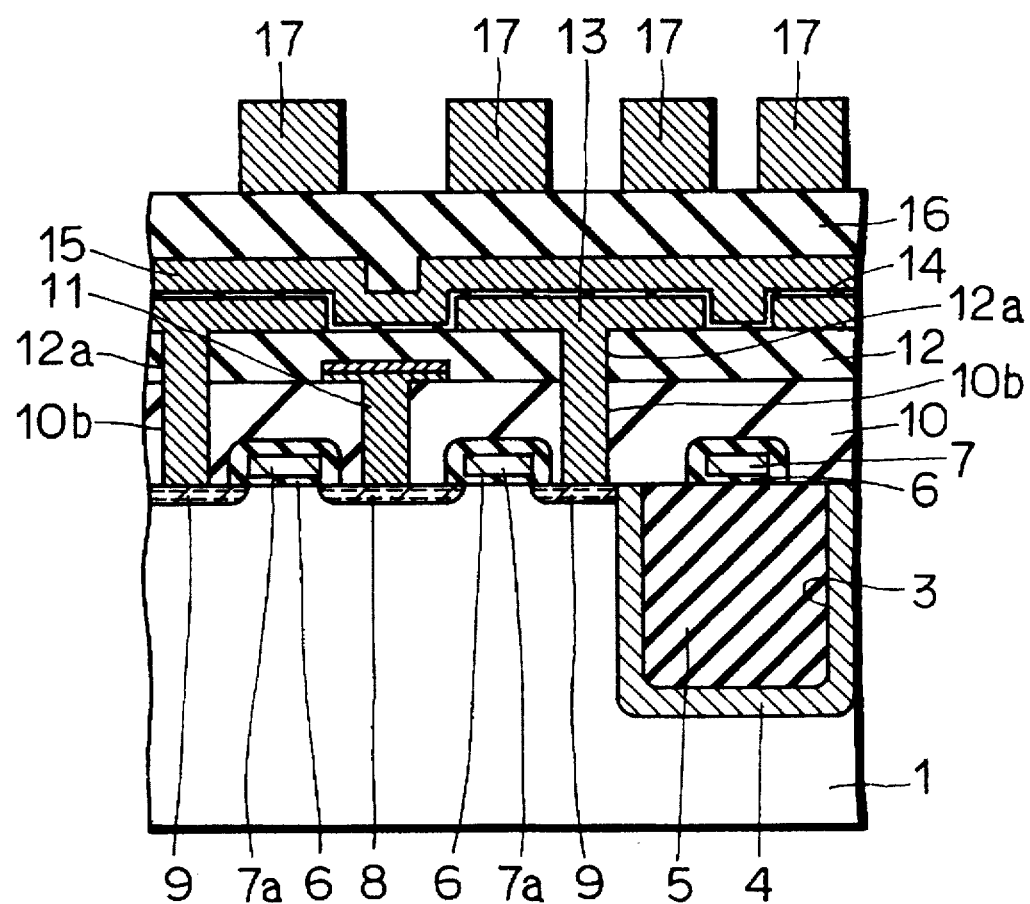

FIGS. 16 to 18 show the fourth embodiment of the present invention, which will be described in the following.

First, in the similar manner as shown in FIGS. 1 and 2 of the first embodiment described above, on the main surface of semiconductor substrate 1, an insulating film 18 such as silicon oxide film ($SiO_2$) or silicon nitride film ($Si_3N_4$) is formed by the CVD method. Resist layer 2 is formed on the entire surface of insulating film 18, and opening 2a is formed in resist layer 2. Using resist layer 2 having opening 2a as a mask, insulating film 18 exposed through opening 2a is etched by conventional etching technique, thus forming an opening 18a at a portion of semiconductor substrate 1 where element isolation forming region is positioned. Then resist layer 2 is removed. At this time, the width of opening 18a of insulating film 18 is the same as the width of opening of resist layer 2, that is, about several tenth μm to 2 μm, taking into account the width of side spacer 22 which will be formed later.

Using insulating film 18 having opening 18a formed as a mask, an impurity of the first conductivity type is introduced by ion implantation, and ion-implanted impurity layer 19 is formed at the main surface of semiconductor substrate 1 exposed at opening 18a. Ion-implanted impurity layer 19 has its width regulated by the width of opening 18a of insulating film 18, and therefore it is about several tenth μm to about 2 μm, for example. The width of the layer 19 is set to be several tenth μm to 1 μm. Ion implantation is performed such that in the periphery of ion-implanted impurity layer 19 within the width from the junction surface to the inside of several tenth to about 1 μm, impurity has peak concentration of about $1 \times 10^{17}$ $cm^{-3}$ to $1 \times 10^{18}$ $cm^{-3}$.

Thereafter, referring to FIG. 16, without heat treatment, an insulating layer such as silicon oxide film ($SiO_2$) or silicon nitride film ($Si_3N_4$) formed of an insulating material different from that of insulating film 18 (when insulating film 18 is formed of silicon oxide film, then silicon nitride film), is deposited to the depth of several tenth μm to about 1 μm on the surface of insulating film 18 by the CVD method. Thereafter, the insulating layer is etched back by anisotropic etching, so that the insulating layer on the surface of insulating film 18 is completely removed and side spacers 22 are formed in opening 18a of insulating film 18. The width of side spacer 22 in contact with semiconductor substrate 1 is the same as the thickness of original deposition, that is, several tenth μm to about 1 μm. This width is the same as the width of impurity layer 4 serving as the channel stopper, which will be formed later.

Thereafter, referring to FIG. 17, by using insulating film 18 having opening 18a and side spacers 22 as a mask, the main surface of semiconductor substrate 1 is etched by using conventional etching technique (anisotropic etching), and a trench 3 is formed in element isolation forming region of semiconductor substrate 1, with the impurity layer 4 in contact with the side surfaces and bottom surface left thereon. The width of trench 3 is regulated by the width of side spacer 22 and opening 18a of insulating film 18 and is about 0.1 μm to 1 μm, for example. The depth is set to be about 0.1 μm, for example. The width of impurity layer 4 in contact with the side surfaces and bottom surface is the same as the width of side spacer 22, for example several tenth μm to about 1 μm.

Since the trench 3 is formed in this manner, the portion of ion-implanted impurity layer 19 which includes much crystal defects caused by ion implantation can be removed in self aligned manner. Therefore, the impurity layer at the side surfaces and bottom surface of trench 3 having very few crystal defects can be used as the channel stopper.

After trench 3 is formed in this manner, insulating film 18 and side spacers 22 are removed, and in the similar manner as shown in FIGS. 5 to 7 of the first embodiment described above, buried insulating layer 5 is formed in trench 3 of semiconductor substrate 1, and thus an element isolating region consisting of trench 3, impurity layer 4 and buried insulating layer 5 is formed surrounding element forming region of semiconductor substrate 1. Thereafter, gate insulating film 6, word line 7 having gate electrode 7a, a pair of source/drain regions 8 and 9, and bit line 11 are formed.

Then, referring to FIG. 18, in the similar manner as shown in FIG. 8 of the first embodiment, insulating layer 12, storage node 13, dielectric film 14, cell plate 15, insulating layer 16 and interconnection layer 17 are formed.

Thereafter, passivation film and so on are formed, thus completing a dynamic random access memory.

In this structure also, as in the first embodiment described above, impurity layer serving as a channel stopper can be formed with easier control, and more minute element isolating region can be provided.

Further, since impurity layer 19 is formed based on opening 18a and trench 3 is formed in impurity layer 19 by using opening 18a and side spacers 22, crystal defects caused by ion implantation for forming impurity layer 4 can be reduced without the step of heat treatment, and therefore even when it is in contact with the source/drain regions 8 and 9 of the switching transistor, leak current from the source/drain regions 8 and 9 through the impurity layer 4 can be reduced as compared with the example shown in FIGS. 19 to 24, and hence degradation of device characteristics such as retention can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming an element isolating region in a semiconductor device, comprising the steps of:

forming a mask consisting of an insulating film having an opening on an element isolation forming region, on a main surface of a semiconductor substrate;

forming a side spacer consisting of an insulating film different from said mask, in contact with an inner wall surface of the opening of said mask;

introducing an impurity having same conductivity type as said semiconductor substrate from above said mask and said side spacer by ion implantation, for forming an ion-implanted impurity layer having a prescribed depth at the main surface of the semiconductor substrate exposed through said mask and said side spacer;

heat treating the semiconductor substrate in which said ion-implanted impurity layer is formed, and diffusing ions introduced to said ion-implanted impurity layer to form an impurity layer;

removing said side spacer, forming a trench by etching said impurity layer on which the opening of said mask is positioned, by using said mask, so that said impurity layer in contact with side and bottom surfaces of said trench serves as a channel stopper; and filling said trench with an insulating material.

2. A method of forming an element isolating region in a semiconductor device, comprising the steps of:

forming a mask consisting of an insulating film having a first opening on an element isolation forming region, on a main surface of a semiconductor substrate;

introducing an impurity having same conductivity type as said semiconductor substrate to said semiconductor substrate from above said mask by ion implantation, and forming an ion-implanted impurity layer having a prescribed depth at the main surface of said semiconductor substrate on which the first opening of said mask is positioned;

heat treating said semiconductor substrate in which said ion-implanted impurity layer is formed, diffusing ions introduced to said ion-implanted impurity layer to form an impurity layer;

forming a second opening by enlarging said first opening of said mask;

forming a trench by etching said impurity layer on which said second opening of said mask is positioned, by using said mask, so that said impurity layer left in contact with side and bottom surfaces of the trench serves as a channel stopper; and filling said trench with an insulating material.

3. A method of forming an element isolation region in a semiconductor substrate, which method comprises:

depositing a layer of insulating material on the substrate;

forming a resist mask on the insulating layer, wherein the resist mask contains an opening therein exposing the insulating layer;

etching the insulating layer to form an opening having a width W, thereby exposing the substrate;

removing the resist mask;

introducing an impurity of the same conductivity as the substrate, after removing the resist mask, from above the insulating layer through the opening having a width W in a direction perpendicular to the substrate by ion implantation to form an ion implanted impurity layer in the substrate;

heat treating the substrate to diffuse the implanted impurity ions, thereby increasing the size of the ion implanted impurity layer to form a diffused impurity region;

forming a trench by etching the semiconductor substrate through the opening in the insulating layer having a width of W to remove substantially all of the ion implanted impurity layer to form a trench having a width of about W, substantially leaving the diffused impurity portion on side and bottom surfaces of the trench to serve as a channel stopper layer; and filling the trench with an insulating material.

4. A method of forming an element isolation region in a semiconductor substrate, which method comprises:

depositing a layer of an insulating material on the substrate;

forming a resist mask on the insulating layer, wherein the resist mask contains an opening therein exposing the insulating layer;

etching the insulating layer to form an opening defined by the insulating material, thereby exposing the substrate;

removing the resist mask;

introducing an impurity of the same conductivity as the substrate, after removing the resist mask, from above the insulating layer through the opening defined by the insulating material in a direction perpendicular to the substrate by ion implantation to form an ion implanted impurity layer in the substrate;

heat treating the substrate to diffuse the implanted impurity ions, thereby increasing the size of the ion implanted impurity layer to form a diffused impurity region;

forming a trench by etching the semiconductor substrate through the opening defined by the insulating material to remove substantially all of the ion implanted impurity layer substantially leaving the diffused impurity portion on side and bottom surfaces of the trench to serve as a channel stopper layer; and filling the trench with an insulating material.

5. The method according to claim 3, wherein the insulating layer comprises an insulating material selected from the group consisting of silicon oxide and silicon nitride.

* * * * *